United States Patent [19]
Huang et al.

[11] Patent Number: 6,080,639
[45] Date of Patent: Jun. 27, 2000

[54] SEMICONDUCTOR DEVICE CONTAINING P-HDP INTERDIELECTRIC LAYER

[75] Inventors: Richard J. Huang, Cupertino; Chi Chang, Redwood City, both of Calif.

[73] Assignee: Advanced Micro Devices, Inc., Sunnyvale, Calif.

[21] Appl. No.: 09/199,265

[22] Filed: Nov. 25, 1998

[51] Int. Cl.[7] .......................... H01L 21/76; H01L 21/4763
[52] U.S. Cl. .......................... 438/435; 438/624; 438/784; 438/437; 438/763; 438/788
[58] Field of Search ........................ 156/345; 204/298.37, 204/298.38; 257/641, 327, 316; 438/784, 624, 396, 634, 435, 788

[56] References Cited

U.S. PATENT DOCUMENTS

| | | |
|---|---|---|
| 5,621,241 | 4/1997 | Jain . |
| 5,679,606 | 10/1997 | Wang et al. .............................. 438/763 |
| 5,716,890 | 2/1998 | Yao ......................................... 438/624 |
| 5,968,610 | 10/1999 | Liu et al. ................................. 438/435 |

*Primary Examiner*—Charles Bowers
*Assistant Examiner*—Hsien-Ming Lee

[57] ABSTRACT

Void formation is avoided without thermal treatment by a gap filling between electrically conductive elements such as stacked gates which are formed atop of isolation regions, with an oxide layer using a HDP technique. The oxide layer is doped with phosphorus to getter mobile ionic contaminants.

12 Claims, 1 Drawing Sheet

SEMICONDUCTOR DEVICE CONTAINING P-HDP INTERDIELECTRIC LAYER

FIELD OF THE INVENTION

The present invention relates generally to a semiconductor device and, more specifically, to a flash memory arrangement wherein conventionally hard to fill gaps which tend to produce voids, are filled with a doped HDP High Density Plasma film.

BACKGROUND ART

During the fabrication of semiconductor devices, such as flash memory devices, it is necessary, following the formation of stack gates, control lines, etc., to fill the gaps therebetween. However, with the ever diminishing size and spacing with which these elements are formed, effective filing of the gaps between the stack gates and/or associated electrically conducive lines/elements which interconnect the gates, with conventional plasma based chemical vapor deposition (CVD) oxide, has become ever difficult to achieve.

In particular, the gap which is defined between two stacked gates 101, 102 of the nature shown in FIG. 1, when filled with boron-phosphorus doped silicate glass, (BPSG) silicone oxide derived from tetraethylorthosilicate (TEOS) or phosphorus doped silicate glass (PSG) deposition is, as shown in FIG. 2, apt to result in a void of the nature denoted by V. This void can be removed only after a relatively long thermal cycle of 850° C. for about 3 minutes, wherein the insulation film 104 is melted and permitted to soften, settle and close the void. However, as the design rules shrink to about $0.18\mu$ and under, with a gap distances of about $0.2\mu$ to about $0.3\mu$, this thermal cycle can no longer be tolerated and therefore it is necessary to be avoid the formation of voids without the use of such high temperature techniques.

Another problem encountered with the formation of the above type of memory, is that CMP (chemical-mechanical polishing) is employed to dress the upper surface of the dielectric layer which is used to encase the gate stacks. In this connection, it is usual to provide a sacrificial cap layer and to subject this layer to CMP. However, during this process in particular, mobile ionic contamination tends to be generated, and leads to the drawback that contaminating particles/ions find their way into the underlying layers and deteriorate the performance of the various elements.

Accordingly, there exists a need for methodology enabling the formation of flash memory devices having a design rule of about $0.18\mu$ or less, without the need of the above mentioned thermal cycle and such that mobile ionic contamination during the formation of such structures are entrapped.

SUMMARY OF THE INVENTION

An advantage of the present invention is a gap filling technique which can be used with flash memory and which utilizes a HDP deposition technique for filling very narrow gaps without the formation of voids and without the need to apply a thermal cycle to remove same.

A further advantage of the present invention to use a doped HDP oxide for gap filling in flash memory applications, wherein the dopant in the film serves as a gettering layer entrapping mobile ionic matter thereby preventing contamination.

Another advantage of the present invention is a method for to gap filling between the lines used in flash memory that are very difficult to fill using conventional CVD techniques.

In order to avoid the formation of voids and the need for thermal treatment to remove such voids in flash memory applications, gaps between electrically conductive features such as stacked gates which are formed atop of isolation regions, are filled with a oxide layer using a HDP technique. The HDP oxide layer is doped with phosphorus to getter mobile ionic contaminants.

More specifically, a first aspect of the invention resides in a method of manufacturing a semiconductor device, the method comprising the steps of: forming a plurality of electrically conductive features having gaps therebetween; and filling the gaps with a doped HDP oxide layer. Embodiments include forming a sacrificial layer over the top of the doped oxide layer and removing at least a part of the sacrificial layer.

The HDP oxide layer is preferably doped with phosphorous, as is the sacrificial layer. Embodiments also include depositing a conformal oxide film over the electrically conductive features and depositing the doped HDP oxide on the conformal oxide film filling the gaps. The electrically conductive features can comprise stacked electrode gates.

Embodiments include forming the HDP oxide layer in a reaction chamber with a power of about 3000 Watt, supplying silane and oxygen at rates of about 10 to about 55 sscm and about 15 to about 100 sscm respectively; and maintaining the temperature in the chamber at about 375° C. to about 450° C. with a bias power of about 1000 to about 2500 Watt. Doping can be achieved by introducing phosphine ($PH_3$) into the reaction chamber during the deposition of the HDP oxide layer.

Another aspect of the present invention resides is a method of manufacturing a semiconductor device having a plurality of gate structures, this method comprising the steps of: forming a plurality of isolation regions; forming a plurality of gate electrode stacks on the plurality of isolation regions with a gap therebetween; forming a conformal oxide film over the stacked gates; filling the gaps between the gate electrodes with a phosphorous doped HDP oxide layer; forming a sacrificial layer over the top of the doped oxide layer; and removing at least a part of the sacrificial layer using CMP. The HDP oxide is deposited in a reaction chamber with a power of about 3000 Watt, supplying silane and oxygen at rates of about 10 to about 55 sscm and about 15 to about 100 sscm, respectively, and maintaining the temperature in the reaction chamber at about 375° C. to about 450° C. with a bias power of about 1000 to 2500 Watt. Phosphorous doping can be achieved by introducing phosphine ($PH_3$) into the reaction chamber at a rate of about 150–400 sscm.

Another aspect of the present invention resides in a semiconductor device comprising: a plurality of electrically conductive features formed on a plurality of isolation regions with a gap therebetween, e.g., about $0.2\mu$ to about $0.3\mu$; a conformal oxide film formed over the electrically conductive elements; and a phosphorous doped HDP oxide layer on the conformal layer filling the gaps. The methods mentioned above can be used to form the above mentioned structure.

BRIEF DESCRIPTION OF THE DRAWINGS

The various features and advantages of the present invention will become more clearly understood as a detailed description of the preferred embodiments is given with reference to the appended drawings wherein.

DETAILED DESCRIPTION OF THE PREFERRED EMBODIMENTS

Figure 1:
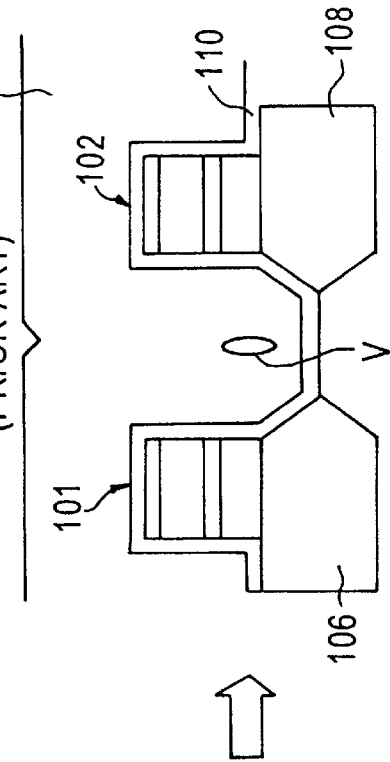
FIG. 1 is a schematic elevational view of a gap which is defined between two stacked gates and to which the present invention is applied.
Figure 2:
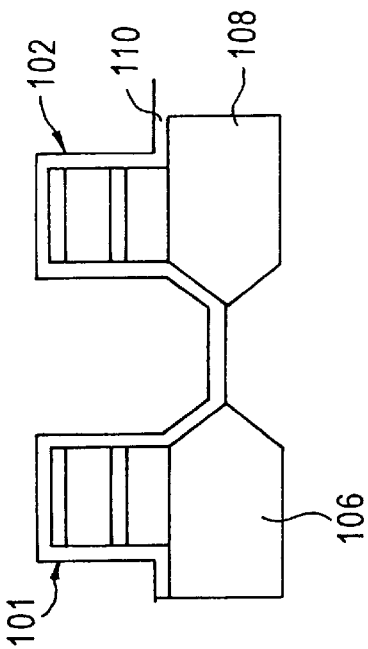
FIG. 2 is a schematic elevational view showing the gap depicted in FIG. 1 filled via BPSG or PSG deposition and depicting a void of the nature discussed above, is formed.
Figure 4:
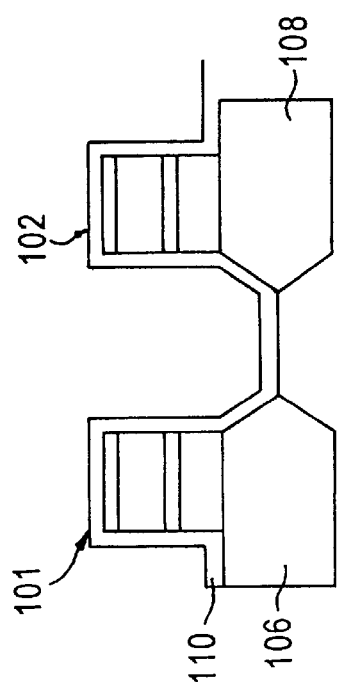
FIG. 4 is a schematic elevational view showing the gap being filled using a doped HDP oxide wherein the formation of the void is avoided.
Figure 3:
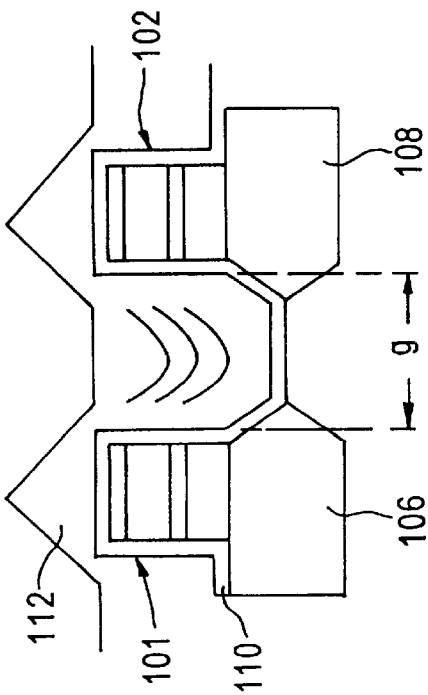
FIG. 3 is a schematic elevational view showing the arrangement depicted in FIG. 2, following a void removing thermal cycle.

FIG. 1 shows two gate electrode stacks 101, 102, formed on isolation regions 106, 108. These stacks 101, 102 are covered with an conformal layer or oxide liner 110 having a thickness of about 500 to about 2000 Å, typically about 1000 Å. Conformed oxide layer it is formed by PCVD using silane. Alternatively, conformed oxide layer 110 can be an oxynitride.

The electrode stacks are then covered with a layer of oxide 112 using a high density plasma (HDP) technique. As is well known, HDP is a chemical vapor deposition with simultaneous de-bias sputtering using a mixture of gases containing silicon source gas, e.g., silane, oxygen and, optionally, a non-reactive gas such as an inert gas. This HDP technique forms a high quality oxide with good thermal stability, low moisture uptake, and excellent mechanical properties. The oxide which is produced using HDP, i.e., HDP oxide, is essentially similar in properties to a dense thermally-grown oxide.

The resulting oxide layer 112 formed on the gate electrode stacks 101, 102, and which fills the gap "g" defined between the gate electrode stacks 101, 102, is such as to be free of voids. The gap "g" is about $0.3\mu$ or less, e.g., about $0.2\mu$ to about $0.3\mu$.

In accordance with the present invention, the HDP oxide layer is doped with phosphorous which acts as a gettering agent to which mobile ionic contaminants become attached and are, thereby, prevented from spreading to the underlying layers of the stacked gate structures 101, 102 and the like.

In accordance with the present invention, HDP oxide deposition is carried out with a power of about 3000 Watt, supplying silane and oxygen at rates of about 10 to about 55 sscm and about 15 to about 100 sscm, respectively. The temperature in the chamber is maintained at about 375° C. to about 450° C. with a bias power of about 1000 to about 2500 Watt. Phosphorous doping is achieved by introducing $PH_3$ into the reaction chamber at a rate of about 150–400 sscm.

Following the formation of the oxide layer 112, a sacrificial or cap layer 114 using silane and oxygen or TEOS, is deposited on top of the oxide layer 112. It is of course within the scope of the present invention to deposit this layer using a HDP technique. It is preferable that this layer also be doped with phosphorous through the use of $PH_3$ for example, and is subjected to CMP after its completion.

As will be appreciated, this process is carried out under relatively low temperatures and avoids the need for a thermal cycle to remove any voids such as those which tend to be produced with the prior art. In addition to this, the presence of the gettering agent (viz., phosphorous) in one or both of the layers 112 and 114, reduces/eliminates mobile ionic contaminant penetration to the levels of the stacked gates etc.

It should be noted that the use of boron is avoided in the above technique.

For further reference to the use of high density plasma (HDP) oxide deposition, reference may be had to U.S. Pat. No. 5,621,241 issued on Apr. 15, 1997 in the name of Jain, the entire disclosure of which is incorporated herein by reference.

The present invention enjoys industrial application in the production of various types of semiconductor devices, including non-volatile memory devices having a design rule of about $0.18\mu$ and under.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well-known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed therein.

What is claimed is:

1. A method of manufacturing a semiconductor device the method comprising the steps of:

forming a plurality of electrically conductive features having a gap therebetween;

filling the gaps with a single, essentially uniformly doped, high density plasma (HDP) oxide;

forming a sacrificial layer directly over the top of the doped HDP oxide layer; and removing at least a part of the sacrificial layer by chemical-mechanical polishing.

2. The method as set forth in claim 1, wherein the doped HDP oxide layer is doped with phosphorous.

3. The method as set forth in claim 1, further comprising the step of doping the sacrificial layer with phosphorous.

4. The method as set forth in claim 1, further comprising the step of forming a conformal oxide film over the electrically conductive features so as to be interposed between the electrically conductive features and the doped HDP oxide layer.

5. The method as set forth in claim 1, wherein the electrically conductive features are stacked electrode gates.

6. The method as set forth in claim 1, comprising: forming the HDP oxide layer in a reaction chamber with a power of about 3000 Watt; supplying silane and oxygen in the reaction chamber at rates of about 10–about 55 sscm and about 15–about 100 sscm, respectively; maintaining the temperature in the chamber at about 375° C.–about 450° C. with a bias power of about 1000–about 2500 Watt.

7. The method as set forth in claim 1, wherein the step of filling the gap with the doped HDP oxide layer includes the step of introducing phosphine ($PH_3$) into the chamber at a rate of about 150–400 sscm, during the deposition of the HDP oxide layer.

8. The method as set forth in claim 1, wherein the gaps are about $0.2\mu$ to about $0.3\mu$.

9. A method of manufacturing a semiconductor device having a plurality of gate structures, the method comprising the steps of:

forming a plurality of isolation regions;

forming a plurality of gate electrode stacks on the plurality of isolation regions so as to be separated from one another by a gap;

forming a conformal oxide film over the stacked gates;

filling the gaps between the gate electrodes with a single phosphorous doped HDP oxide layer having an essentially uniform dopant concentration;

forming a sacrificial layer directly over the top of the doped oxide layer; and removing at least a part of the sacrificial layer using a chemical-mechanical polishing technique.

10. The method as set forth in claim 9, wherein the invention, the HDP is carried out in a reaction chamber with a power of about 3000 Watt; supplying silane and oxygen into the reaction chamber at rates of about 10–about 55 sscm and about 15–about 100 sscm, respectively; and maintaining the temperature in the reaction chamber at about 375° C.–about 450° C. with a bias power of about 1000–about 2500 Watt.

11. The method as set forth in claim 10, comprising phosphorous doping by introducing phosphine ($PH_3$) into the reaction chamber at a rate of about 140–400 sscm.

12. The method as set forth in claim 9, wherein the gap is about $0.2\mu$ to about $0.3\mu$.

* * * * *